(12) United States Patent
Thijs et al.

(10) Patent No.: US 8,508,893 B2
(45) Date of Patent: Aug. 13, 2013

(54) METHOD FOR PROVIDING WIDEBAND ELECTROSTATIC DISCHARGE PROTECTION AND CIRCUITS OBTAINED THEREWITH

(75) Inventors: Steven Thijs, Willebroeck (BE); Dimitri Linten, Boortmeerbeek (BE)

(73) Assignee: IMEC, Leuven (BE)

( * ) Notice: Subject to any disclaimer, the term of this patent is extended or adjusted under 35 U.S.C. 154(b) by 313 days.

(21) Appl. No.: 12/869,444

(22) Filed: Aug. 26, 2010

(65) Prior Publication Data

US 2011/0051300 A1     Mar. 3, 2011

Related U.S. Application Data

(60) Provisional application No. 61/237,501, filed on Aug. 27, 2009.

(51) Int. Cl.
*H02H 3/08* (2006.01)
*H02H 9/02* (2006.01)

(52) U.S. Cl.
USPC .............. 361/56; 361/93.5; 361/54; 361/111

(58) Field of Classification Search
USPC ................... 361/56, 111, 93.5, 54
See application file for complete search history.

(56) References Cited

U.S. PATENT DOCUMENTS

| 5,301,081 | A | * | 4/1994 | Podell et al. | 361/56 |
| 5,969,929 | A | | 10/1999 | Kleveland et al. | |
| 6,621,673 | B2 | * | 9/2003 | Lin et al. | 361/56 |
| 2006/0256489 | A1 | | 11/2006 | Ker et al. | |

FOREIGN PATENT DOCUMENTS

EP     2037501     3/2009

* cited by examiner

*Primary Examiner* — Rexford Barnie
*Assistant Examiner* — Zeev V Kitov
(74) *Attorney, Agent, or Firm* — McDonnell Boehnen Hulbert & Berghoff LLP

(57) ABSTRACT

An distributed electronic circuit (1), such as a transmission line or distributed amplifier, is disclosed comprising an input terminal (2), an output terminal (3), power supply lines (4,5), a sequence of sections (61, 62, 63, 64, 65), between the input terminal (2) and the output terminal (3), arranged to transfer an electrical signal from one section to another section; each section (61, 62, 63, 64, 65) comprising at least one Electro Static Discharge (ESD) protection component (9) configured to, upon occurrence of an ESD event, convey corresponding ESD currents to a power supply line (4, 5); and wherein the ESD components (9) of the respective sections (61, 62, 63, 64, 65) are selected such that, upon occurrence of an ESD event, at least one subsequent section (62, 63, 64, 65) is triggered before the first section (61).

9 Claims, 13 Drawing Sheets

METHOD FOR PROVIDING WIDEBAND ELECTROSTATIC DISCHARGE PROTECTION AND CIRCUITS OBTAINED THEREWITH

CROSS-REFERENCE TO RELATED APPLICATIONS

This application is a non-provisional application claiming priority to U.S. Patent App. No. 61/237,501 filed on Aug. 27, 2009, which is included herein by reference for all purposes.

FIELD

The present disclosure relates to integrated electronic circuits, more specific to integrated electronic circuits containing a sequence of stages, whereby Electro Static Discharge (ESD) protection is provided at each individual stage.

STATE OF THE ART

During manufacturing or handling of electronic devices, such as integrated electronic circuits, electric charge may accumulate on tools, persons and/or the electronic device itself. This electric charge may result in undesired large voltage and/or current Electro Static Discharge (ESD) pulses being applied to the electronic device when discharging through this semiconductor device e.g. via its input terminal or via its power supply lines. These large pulses can cause failure of the semiconductor device for various reasons, such as but not limited to, dielectric breakdown, junction breakdown, breakage of conductors, and/or heating of the device.

Electro Static Discharge (ESD) protection devices are hence crucial to safe-guard a failure-proof operation of such electronic devices. These ESD protection devices are designed and arranged to bypass such ESD pulse to a power supply. Each ESD protection device is primarily characterized by is trigger voltage $V_t$, i.e. the voltage at which the ESD protection device starts conveying the ESD current and will switch to a low-resistance mode, its holding voltage $V_h$, i.e. the voltage over the ESD protection device when conveying the ESD current in its low-resistance mode, and its breakdown current $I_{bd}$, i.e. the maximum amount of current the ESD protection device can convey in this low-resistance mode before failure thereof, the latter parameter being a metric for the ESD robustness or the amount of ESD stress a ESD protection device can withstand. Typically these ESD protection devices are added at the terminals of the electronic device, e.g. at an input terminal to prevent incoming ESD pulses from entering in the electronic device, or e.g. between power supply lines to maintain a minimal power supply voltage. The ESD protection for the whole of the electronic device is thus provided by inserting an ESD protection device at one particular location, which device is designed sufficiently large to accommodate the expected ESD pulses.

The impedance introduced by such lumped ESD protective device, in particular its capacitive load, can have a substantive impact on the operation of the protected electronic device. An example thereof is the ESD protection of analogue electronic circuits, such as Radio Frequency (RF) circuits, whose operation is dependent on the exact impedance value of the constituting elements including the parasitic contribution of elements such as ESD protection devices.

B. Kleveland and H. Lee discloses in U.S. Pat. No. 5,969,929 distributed ESD protection as a possible solution for providing ESD protection in wideband RF circuits. Kleveland discloses distributing the parasitic ESD capacitance over an artificial transmission line, such that impedance matching conditions can be maintained at 50Ω over the full RF bandwidth. The ESD protection is distributed by inserting ESD elements in each section i of the transmission line. In such distributed ESD protection design, all ESD protection elements are equal in size and in ESD characteristics assuming that in case of an evenly distributed ESD current all ESD protection devices have the same contribution to the overall ESD protection. In this patent application this distributed ESD protection approach will be further referred to as Equal-Sized Distributed ESD (ES-DESD). However, such ES-DESD design fails prematurely since the ESD efficiency of the ESD protection element associated with a section i of the transmission line decreases when this section i is positioned further down the transmission line. With increasing length of the transmission line, the contribution to the overall ESD protection of the ESD component of the last sections of the transmission line becomes negligible.

In US patent application US 2006/0256489, M. Ker and C. Lee discloses a modification of the above ES-DESD protection approach. Here the ESD protection device of the first section of the transmission line has the largest dimensions thereby allowing more ESD current to be conveyed compared to the ESD protection devices of the subsequent sections. The dimensions of the ESD protection device of a section of the transmission line will decrease with increasing position of along the transmission line. In this patent application this alternative distributed ESD protection approach will be referred to as Decreasing-Sized Distributed ESD (DS-DESD). As each part of the transmission line will have a different parasitic ESD capacitance because of the change in dimensions of the corresponding ESD protection device, a careful design of the individual sections of the transmission line must be done in order to still achieve reasonable good RF performance while ensuring that each stage contributes to the overall ESD protection of the amplifier as combined impedance of the section and of the corresponding ESD protection device must provide the desired impedance matching of the transmission line.

AIMS

The present disclosure aims to provide integrated electronic circuits with ESD protection offering the desired circuit performance as well as the desired ESD protection performance.

The present disclosure aims to provide simple methods for designing electronic circuits offering the desired circuit performance as well as the desired ESD protection performance.

The ESD protection devices incorporated in the integrated electronic circuit provide sufficient protection against ESD damage while the overall integrated circuit still demonstrates a low-loss, impedance-matched operation.

SUMMARY

The present disclosure discloses integrated electronic circuits which overcome the problems of the prior art mentioned above.

An distributed electronic circuit is disclosed comprising an input terminal, an output terminal, power supply lines, a sequence of sections, between the input terminal and the output terminal, arranged to transfer an electrical signal from one section to another section, each section comprising at least one functional device and at least one Electro Static Discharge (ESD) protection device configured to, upon occurrence of an ESD event, bypass the functional device and convey corresponding ESD currents to a power supply line, and wherein the ESD protection devices of the respective sections are selected such that, upon occurrence of an ESD event, at least one subsequent section is triggered before the first section.

The trigger voltage of the ESD device of the first section in distributed circuit is selected to be higher, in absolute value, than the trigger voltage of at least one of the corresponding ESD device of a subsequent section. Preferably the trigger voltage of the ESD protection device in one section is equal to or smaller than the trigger voltage of the ESD protection device of the foregoing section.

Preferably the ESD protection devices of the different sections have substantially the same parasitic impedance to the circuit.

The distributed circuit can be a transmission line and the at least one functional device is then a passive device.

The distributed circuit can be a distributed amplifier and the at least one functional device contains an active device.

BRIEF DESCRIPTION OF THE FIGURES

FIG. 9 shows TLP-IV measurements for design with prior art ES-DESD and with distributed ESD protection according to an embodiment: Vss stressed positive versus RF-IN.

DETAILED DESCRIPTION

Figure 1:
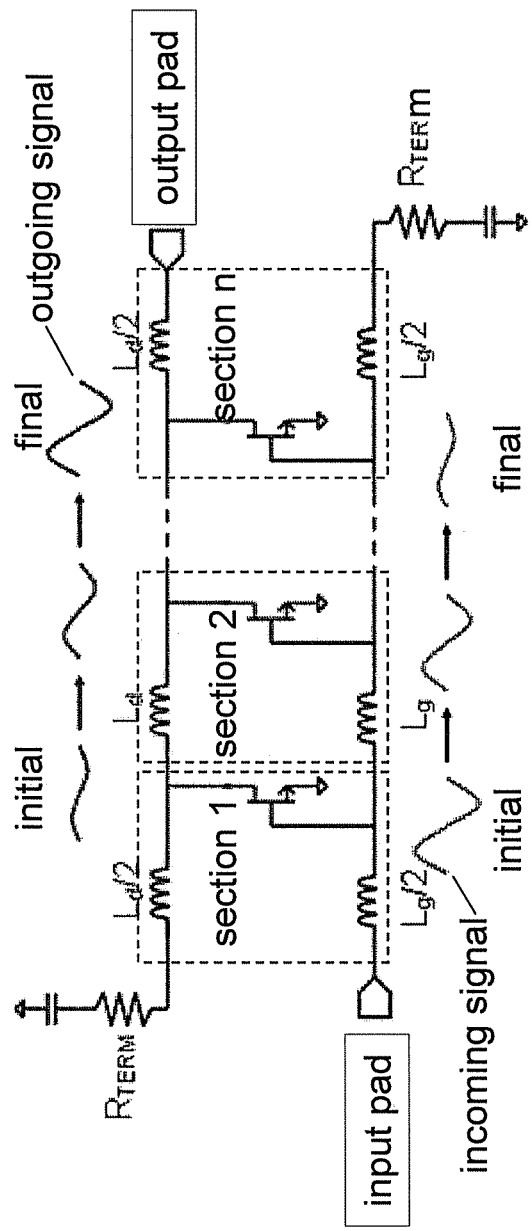
FIG. 1 shows a prior art circuit diagram of distributed amplifier, where $L_g$ and $L_d$ are the equivalent inductance of the gate and drain transmission line section respectively, and $R_{TERM}$ is the termination resistance.

The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

For the purpose of teaching a distributed amplifier (DA) is used as an example of an integrated electronic circuit configured as a distributed circuit. This distributed circuit is arranged as a sequence of stages or sections.

Such distributed amplifiers are widely used to achieve flat gain over very wide frequency bands in applications such as instrumentation, electronic warfare and wireless communication systems. In a distributed amplifier, a set of artificial input and output transmission lines, which are coupled through the transconductance of gain stages i provided along the transmission lines, are connected in parallel. A transmission line is defined as a set of conductors having an inductance and a capacitance per unit length and typically defined by characteristic impedance. In this description with transmission line is also meant a conductor with a distributed inductance and to which conductor lumped capacitors are connected along its length, these lumped capacitors being added as passive elements or as part of active device such as diodes or transistor. The inductance value of the conductor and the capacitance values of the lumped capacitors are selected to provide constant impedance to an RF signal along the length of the conductor comparable to the characteristic impedance of a true transmission line. A principal schematic of such distributed amplifier is shown in FIG. 1 where $L_g$ and $L_d$ are the equivalent inductance of the gate and drain transmission line sections respectively, and $R_{TERM}$ is the termination resistance. The input and output transmission lines are partitioned in sections whereby each section contains an amplifier comprising at least one transistor.

As such distributed amplifier is connected to the outside world via its input-terminal connected to an antenna, also here adequate ESD protection is required. Using conventional ESD protection, dual-diodes are placed as ESD protection devices at the RF-terminal to deviate an ESD current to the power supply lines. The parasitic capacitance introduced by these ESD protection devices results in severe impedance mismatch as discussed in the state-of-the-art section above.

Narrowband cancellation techniques to tune-out this parasitic capacitance only operate at a given frequency and hence cannot be used for wideband ESD protection.

Topology Description

Figure 3:
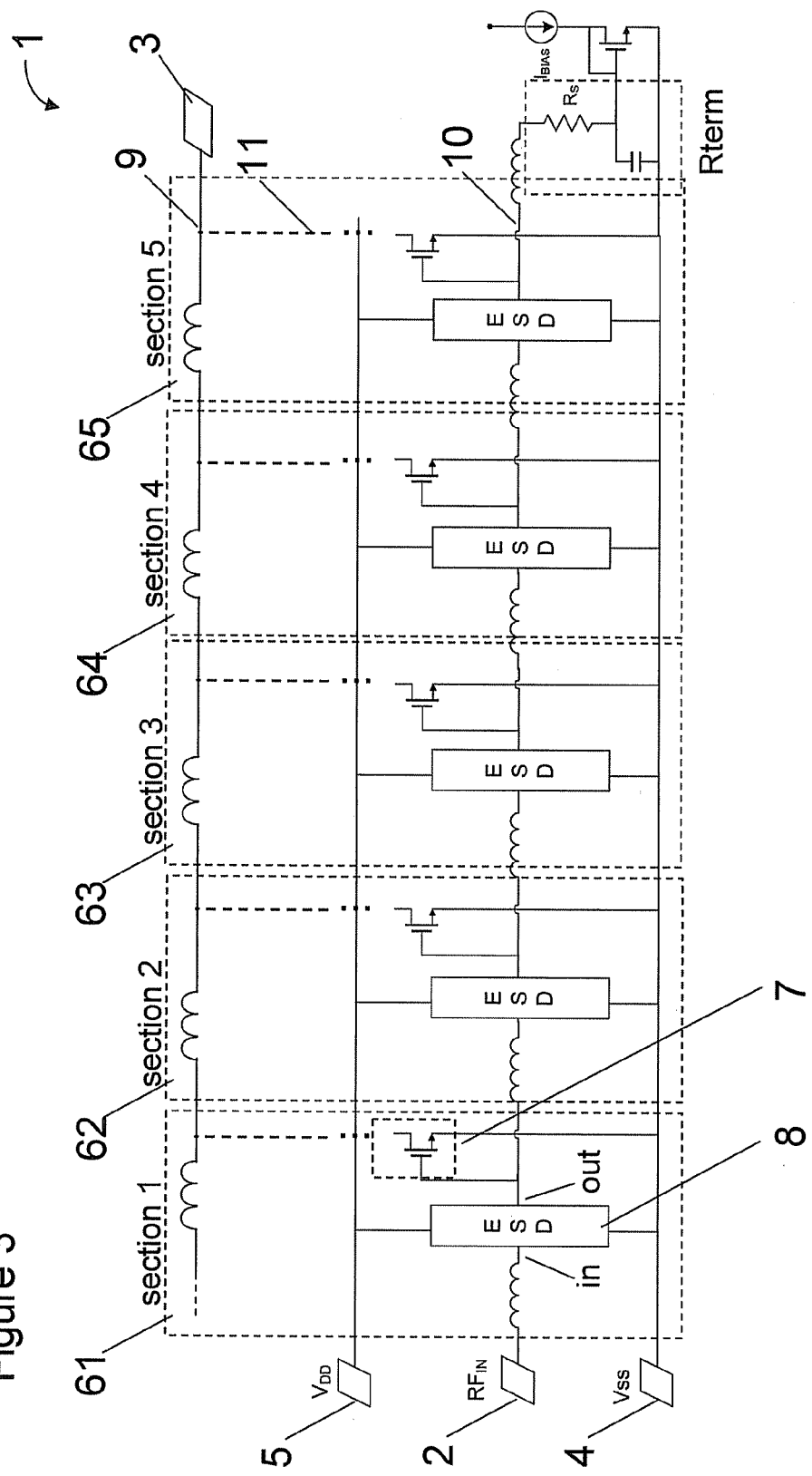
FIG. 3 shows a schematic of the gate transmission line of the DA with distributed ESD protection according to an embodiment.

FIG. 3 shows that in each section $6i$ i, with i being an integer ranging from 1 to n, wherein each section represents a gain stage of the distributed amplifier, preferably a cascode topology is chosen for the amplifying device to reduce the Miller effect which is typical for nanometer-scale CMOS, resulting in higher power gain, wider bandwidth and improved reverse isolation.

Figure 2:
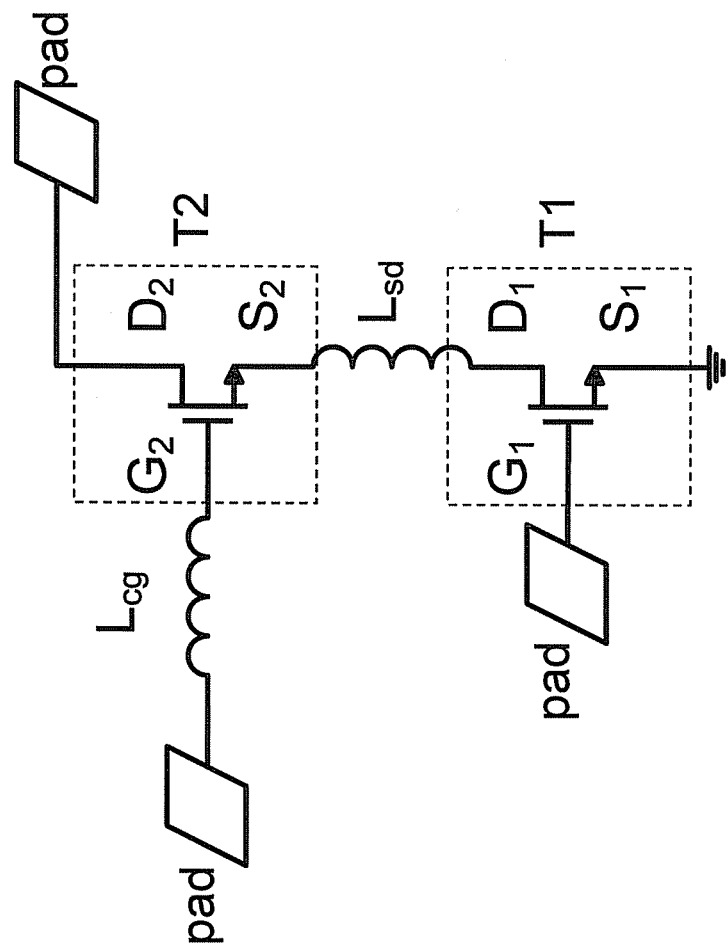
FIG. 2 shows a prior art cascode transistor pair with two additional transmission lines $L_{cg}$ (at the gate of the cascode transistor) and $L_{sd}$ (between source and drain of the two transistors) for drain line loss compensation.

Preferably, an additional loss-compensation technique for the drain artificial transmission line can be used. This technique is built on the properties of the common-gate field effect transistor of the cascode pair, which can present at its drain a broad-band (frequency-dependent) negative resistance. The compensation is realized with two additional transmission lines $L_{cg}$ (at the gate G2 of the cascode transistor T2) and $L_{sd}$ (between source S2 and drain D1 of respective transistors T2 and T1) for drain line loss compensation as shown in FIG. 2. $L_{cg}$ increases negative resistance and improves gain at high frequencies. $L_{sd}$ changes the frequency dependence of the negative resistance term and its value is optimized in order to ensure end-of-band stability and to obtain a flat frequency response.

The input 10 and output 9 transmission lines to the distributed amplifying device can be composed of line sections in microstrip technology implemented in an above-IC technology whereby the underlying transistors of the amplifying devices are manufactured on a semiconductor substrate. The number of stages $6i$ i was fixed to n=5. The input transmission line 10 is connected to an input terminal INPUT PAD 2, while the output transmission line 9 is connected to an output terminal OUTPUT PAD 3. The output transmission line 9 is linked 11 with the input transmission line 10.

Figure 4:
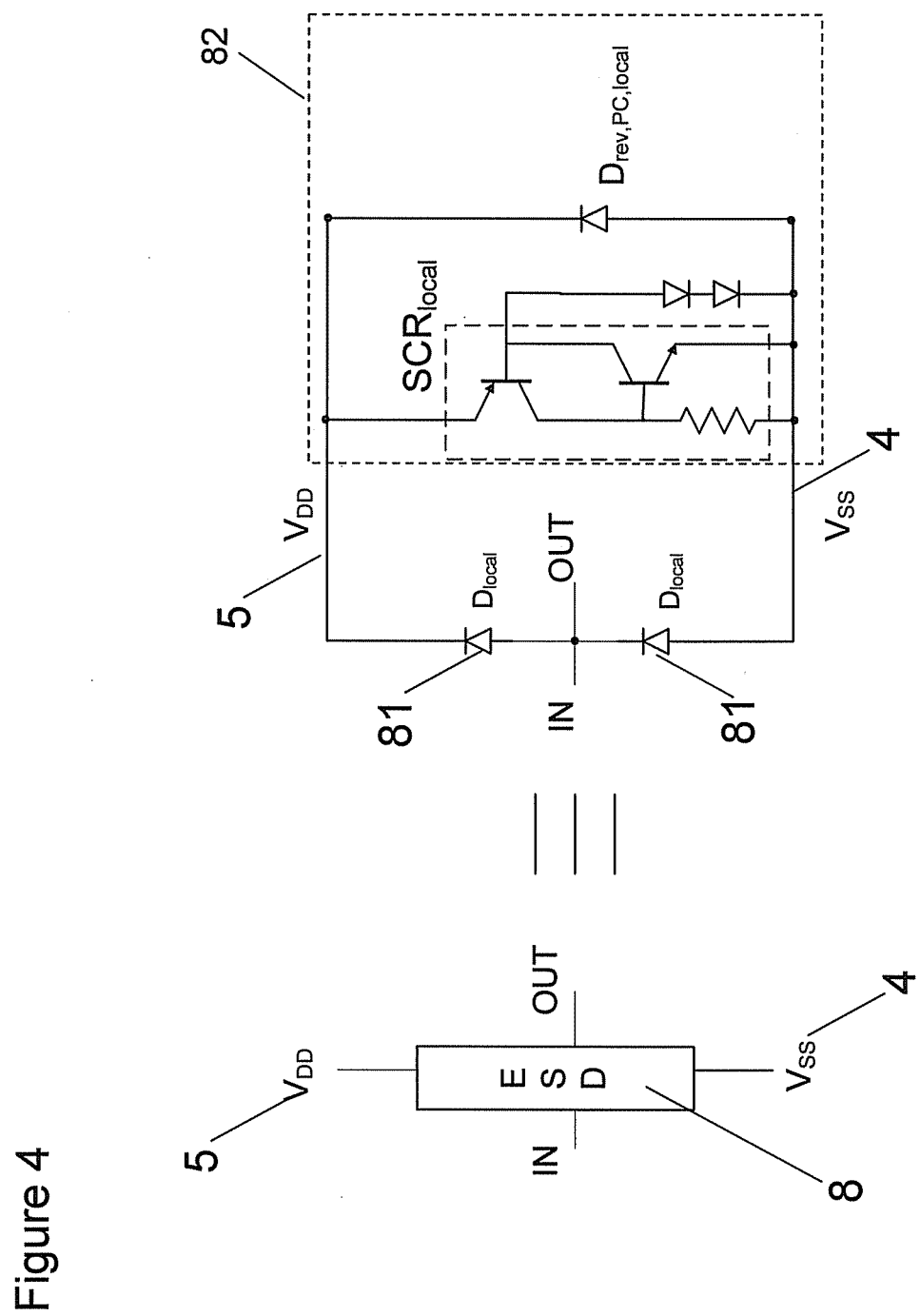
FIG. 4 shows ESD protection elements that have been distributed along the transmission line of FIG. 3

In each section $6i$ i, an ESD protection device 8 is placed as seen in FIG. 3 as part of the distributed ESD protection. The ESD protection devices 8 are connected to the power supply lines Vdd 5 and Vss 4. Only minor layout modifications are needed to the unprotected distributed amplifier. In this example each ESD protection device 8 consists of two ESD protection elements 81 and 82, i.e. two diodes $D_{local}$ 81 connected to respectively the power supply line Vdd 5 and Vss 4 and a small local power clamp 82 in between the power supply lines Vdd 5 and Vss 4. By placing this local power clamp 82, any additional bus resistance can be avoided. A schematic of an example of such individual ESD device is shown in FIG. 4. Of course other ESD protection elements can be used as will be discussed further on. The local power clamp 82 is optionally.

The diodes 81 are preferably poly-defined because of speed reasons: gate diodes have a faster response to an ESD device than classical vertical junctions. As power clamp (PC) 82, a gated Diode Triggered Silicon Controlled Rectifier (DTSCR) with two gated trigger diodes is used. When used as local clamp 82, the DTSCR is 8 μm wide, while a separate 60 μm version is used as a big power clamp.

Three versions of the 5-stage distributed amplifier 1 have been realized. A first version is implemented without any ESD protection (no-ESD). In a second version, the dual diodes $D_{local}$ 81 in every section $6i$ have a width of 8 μm in each stage which corresponds to the Equal-Sized Distributed ESD (ES-DESD) discussed in the state-of-the-art section. This dimension of the diodes $D_{local}$ 81 roughly corresponds to 10 fF parasitic capacitance, which can be tolerated by the RF design (see section on RF performance).

Figure 6:
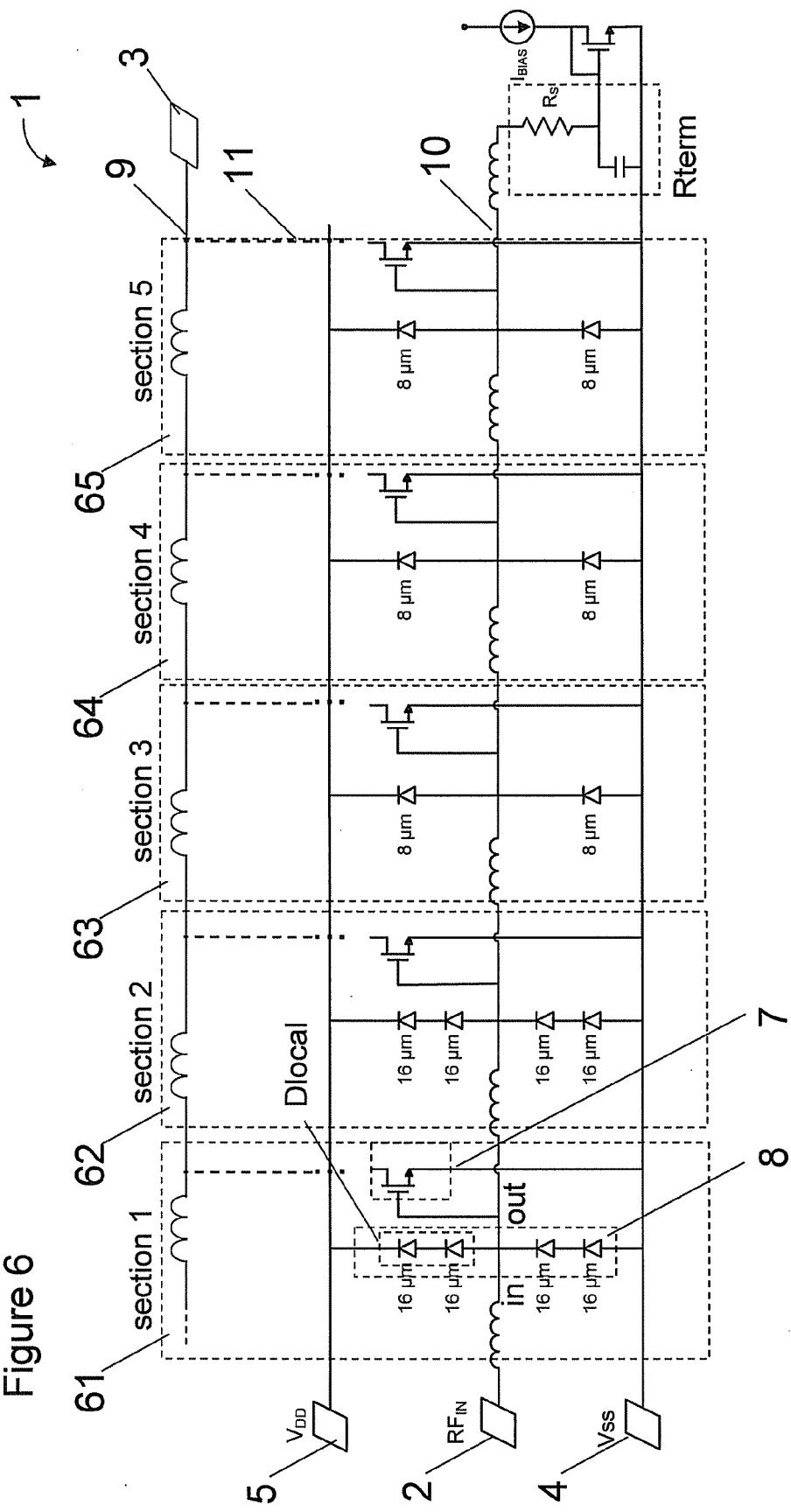
FIG. 6 shows a schematic of the gate transmission line of the DA with distributed ESD protection according to an embodiment.

Since the ESD performance of ES-DESD protection devices is not efficient as discussed in the state-of-the-art section, a distributed ESD protection methodology is now disclosed and applied to this distributed amplifier without the need for going into complex ESD-RF co-design solutions. In this methodology, the diodes $D_{local}$ 81 in FIG. 4 of the first two stages $6i$ with i=1, i=2 are each replaced by two diodes in series, whereby each of these series diodes is of double size, i.e. 16 μm, compared to the diodes in the subsequent stages $6i$ with i=3-5 as shown in FIG. 6. In FIG. 6 the local power clamp 82 is not shown. As such, the total parasitic capacitance contribution of the ESD protection device 8 in the first two sections 61, 62 remains roughly the same as for the last three sections 63, 64, 65, allowing the impedance of each RF stage $6i$ to remain essentially unaltered such that in the design of the distributed amplifier 1 only the same parasitic impedance is to be taken into account for each section or gain stage $6i$ which of course reduces the complexity of to overall analogue design process of the RF circuit 1. To be complete, the capacitance contribution from the nwell-pwell junction should be accounted for as well.

In the distributed amplifier 1 of FIG. 3 as protected according the ESD methodology disclosed, the center stage 63 will turn-on first, in which case the ESD methodology can be labeled as Center Balanced Distributed ESD CB-DESD, since the first two stages $6i$ with i=1-2 require two diodes in series to be forward biased instead of one, as is the case in the last three sections $6i$ with i=3-5, before these first two sections 61, 62 start conducting the ESD current, hence the first two sections 61, 62 have a higher trigger voltage and will respond later. At higher current levels, the first two stages 61, 62 will kick in as well.

SPECTRE® simulations are used to investigate the disclosed distributed ESD protection architecture.

Figure 5:
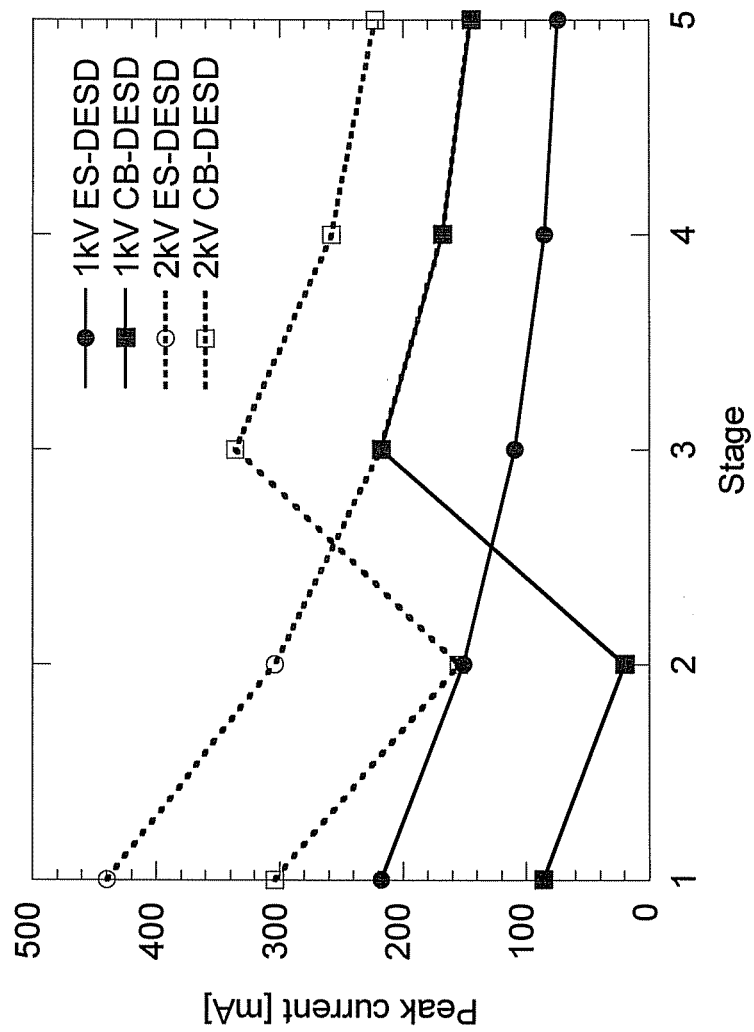
FIG. 5 shows a comparison between HBM ESD performance obtained via SPECTRE® simulations on a 5 stage distributed ESD protection according to prior art ES-DESD (circle) and according to an embodiment of the disclosure (square).

FIG. 5 compares ESD performance of the ES-DESD (circle) topology with the CB-DESD (square) topology during a 1 kV (filled) and 2 kV (open) Human Body Model (HBM) simulation. In a HBM simulation 2 kV HBM was the ESD target specification as a 2 kV voltage is injected from a 100 pF load through a 1.5 kOhm resistor into the input pad of the distributed amplifier. The Peak current [mA] through each stage i is plotted. For 1 kV HBM, ES-DESD shows a maximum ESD current of 220 mA in the first stage, which ESD current decreases in the next stages. CB-DESD shows similar maximum current of 220 mA, but which is now reached in stage i=3 rather than in stage i=1. When comparing the distribution of the ESD current over the different sections $6i$ of the distributed amplifier 1, ES-DESD is more evenly distributed than CB-DESD, because in the latter, stage 62 almost does not contribute to the current conduction. The voltage required to forward bias the two series diodes in stage $6i$ with i=2 is barely reached.

The benefit of the disclosed ESD methodology and corresponding circuit architecture is clearly visible when increasing the ESD stress level.

FIG. 5 also shows the Peak current results in each stage $6i$ during a 2 kV HBM simulation. Now the situation is altered as the maximum ESD peak current in stage $6i$ with i=1 for ES-DESD (440 mA) is much larger than the maximum ESD peak current in stage $6i$ with i=3 for CB-DESD (336 mA). During a 2 kV HBM pulse, CB-DESD distributes the ESD current more evenly than ES-DESD as the ESD protection devices 8 of the first two stages $6i$ with i=1-2 of the CB-DESD start to turn on as well, be it later than the ESD protection devices 8 of the subsequent stages $6i$ with i=3-5. When further increasing the ESD level, these first two stages 61, 62 will take more and more of the current until finally failure occurs. For a typical ESD robustness of 50 mA/μm per width for a symmetrical 2-sided diode in such CMOS technology, the 8 μm diode in the first stage 6i with i=1 of ES-DESD architecture would fail during the 2 kV HBM stress, while all diodes in the stages 6i with i=1-5 would survive in the CB-DESD architecture.

RF Performance

Figure 7:
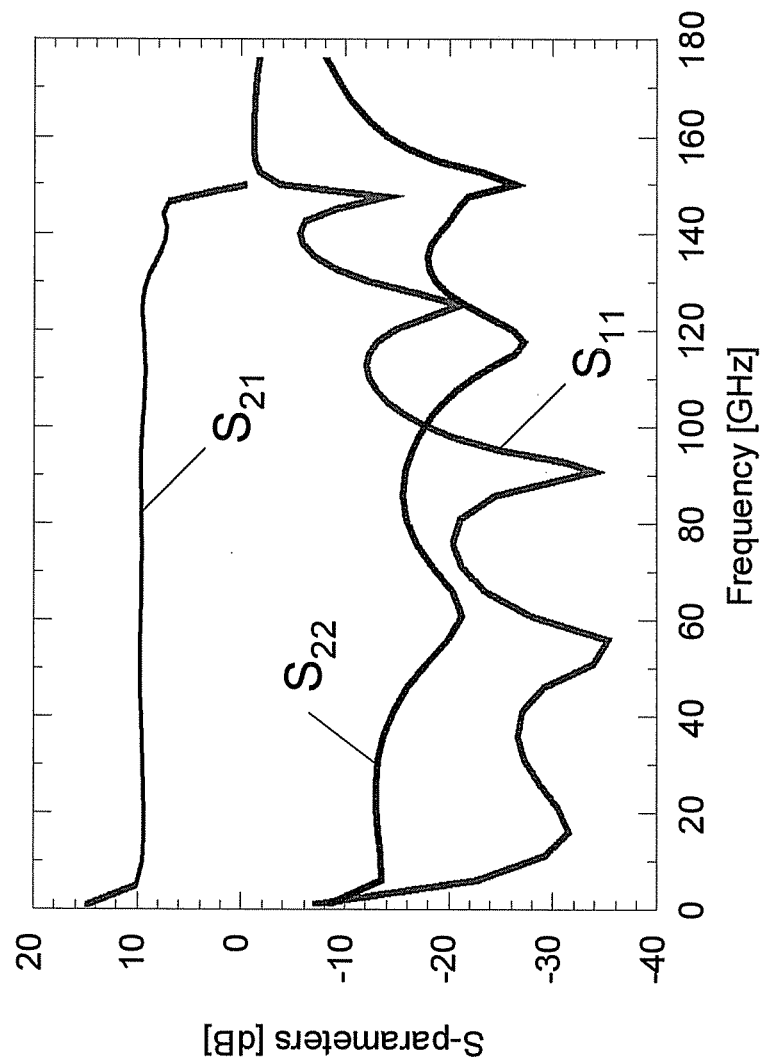
FIG. 7 shows S-parameter simulation results for design without ESD protection devices, (Power gain $S_{21}$ and input and output matching $S_{11}$ and $S_{22}$ respectively)

The impact on the RF performance of the distributed ESD protection is analyzed based using the Advanced Design System simulation software from Agilent Technologies. S-parameter simulation results are shown in FIG. 7. Biasing the unprotected design up to a power consumption of 38 mW, a power gain S21 of 9.3 dB is simulated between 1 and 136 GHz with a 3 dB cut-off frequency f-3 db of 148 GHz. A gain-bandwidth product GBW of 426 GHz is achieved. Up to 130 GHz, input S11 and output matching S22 are better than −10 dB and −12.8 dB, respectively. Also Noise Figure (NF) IP1 dB i.e. the component's 1 dB input compression point in dBm, defined as the input level that produces an output 1 dB lower than it should be for linear operation, are determined.

Figure 8:
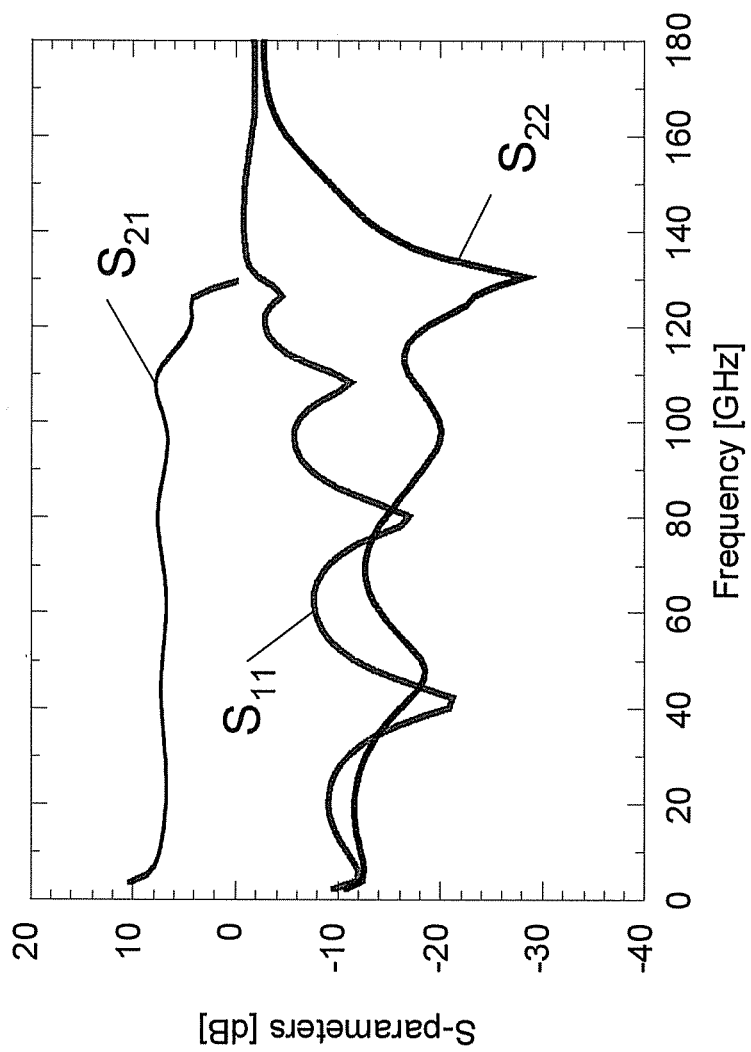
FIG. 8 shows S-parameter simulation results for design with prior art ES-DESD and with distributed ESD protection according to an embodiment (Power gain $S_{21}$, b) input and output matching $S_{11}$ and $S_{22}$, respectively)

By adding the ESD protection diodes either in ES-DESD architecture or in the CB-DESD architecture, only a slight performance degradation is noticed. FIG. 8 shows the small signal S-parameters of distributed amplifier designs 1 having respectively an ES-DESD architecture and a CB-DESD architecture.

An RF performance summary for the three architectures is presented in Table 1, where the Figure Of Merit (FOM) is defined as:

$$FOM = \frac{\text{Gain}}{P_{DC}} \cdot \frac{f_{-3dB}}{f_t^{NMOS}} \quad (1)$$

TABLE 1

RF simulation performance summary

|  | No-ESD | ES-DESD & CB-DESD |
|---|---|---|
| BW [GHz] | 1-130 | 1-110 |
| S21 [dB] | 9.1 ± 0.4 | 8 ± 0.6 |
| S11 [dB] | <−10 | <−6.5 |
| S22 [dB] | <−12.8 | <−12 |
| IP1 dB [dBm] | −2.3 | — |
| NF [dB] | <4.5 | — |
| f-3 dB [GHz] | 148 | 120 |
| GBW [GHz] | 426 | 305 |
| FOM | 30.9 | 22.2 |

ESD Performance

Figure 9:
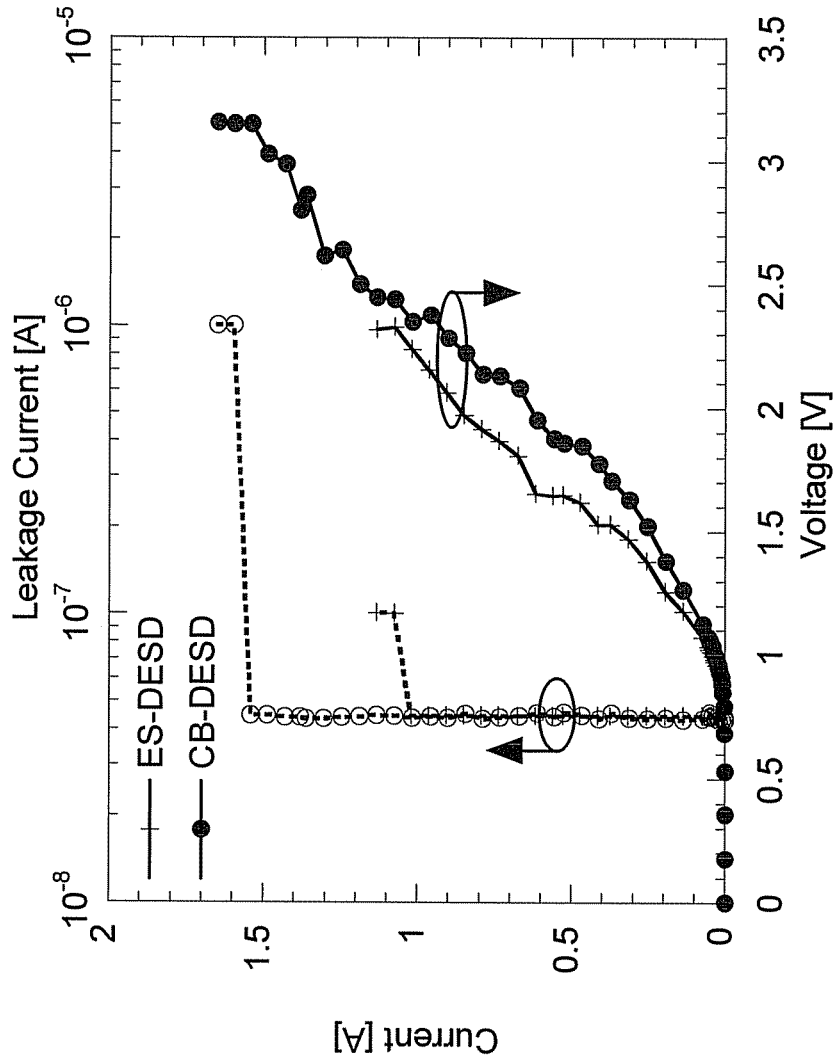
Figure 10:
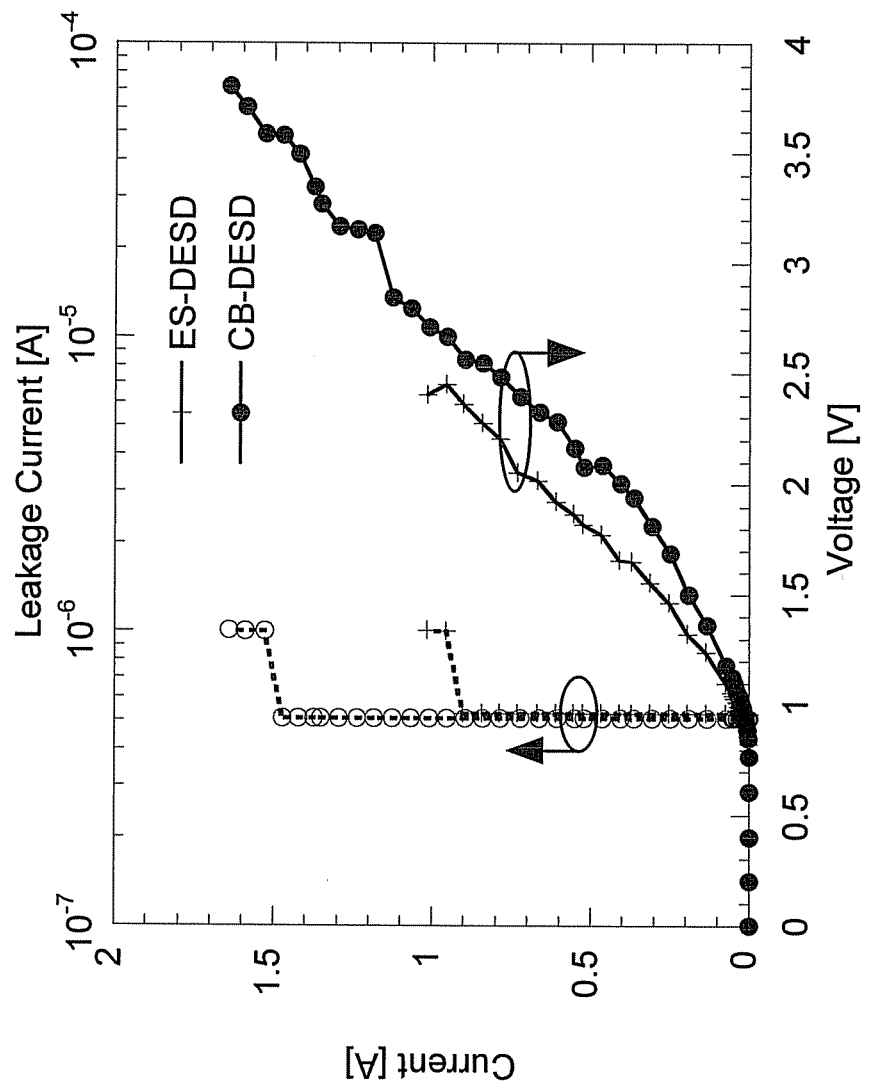
FIG. 10 shows TLP-IV measurements for design with prior art ES-DESD and with distributed ESD protection according to an embodiment: RF-IN stressed positive versus VDD.
Figure 11:
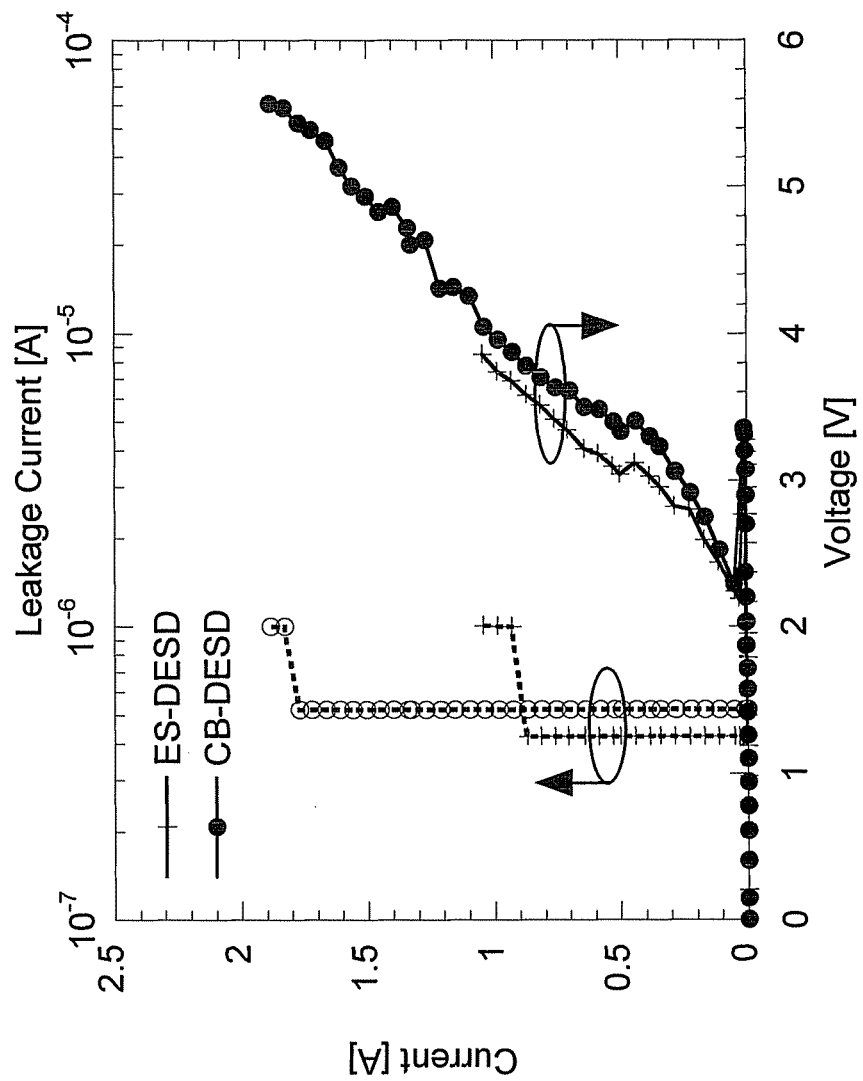
FIG. 11 shows TLP TLP-IV measurements for design with prior art ES-DESD and with distributed ESD protection according to an embodiment: RF-IN stressed positive versus VSS.

Transmission Line Pulses (TLP) measurements were performed to compare the ESD robustness of both ES-DESD and CB-DESD architectures. A short-calibration has been performed to yield accurate voltage measurement results. FIG. 9 through FIG. 11 show the TLP-IV curves for different pin combinations, i.e. polarity of the signal on the input pad referred to respectively the Vss 4 and the Vdd 5 power supply line. In all cases, an $It_2$ current, used as a metric for the ESD strength and corresponding to the maximum current that flows through the ESD protection device before it fails thereby resulting in a subsequent failure of the ESD protected circuit, improvement of at least 50% is measured for CB-DESD (filled circles).

For example, in FIG. 9, TLP pulses were applied between Vss 4 positive biased and RF-IN 2 negative biased [Vss+ IN−]. CB-DESD (filled circle) initially has higher on-resistance as shown by the smaller current, because the third stage 6i with i=3 starts to conduct first, however it fails at 1.5 A, whereas the reference ES-DESD (cross) fails already at 1 A TLP. This corresponds to the targeted 2 kV HBM robustness for CB-DESD as predicted by the SPECTRE® simulations in FIG. 5. SPECTRE® is a SPICE level circuit simulator for analogue circuits provided by CADENCE®. The CB-DESD architecture shows a 50% improvement in $It_2$ current over the ES-DESD architecture.

FIG. 10 shows similar results for TLP stress between RF-IN 2 positive biased and Vdd 5 negative biased [IN+Vdd−], whereby the CB-DESD (filled circle) architecture results in a better ESD performance then the ES-DESD (cross) architecture as demonstrated by the difference in current upon failure of the device. The CB-DESD architecture shows a 65% improvement in $It_2$ current over the ES-DESD architecture.

When stressing RF-IN 2 positive to Vss 4 negative [IN+Vss−], as show in FIG. 11, the current will flow through the ESD protection diode up Dlocal 81 and then through the local power clamp 82 to ground Vss 4. The increased failure level of 1.8 A for CB-DESD (filled circle) can be attributed to the additional current path to Vss, formed by the parasitic pnp of the nwell diode between RF-in 2 and Vdd 5. If this size of this diode is increased then also the parasitic pnp will increase allowing more ESD current to be conveyed. The CB-DESD architecture shows a 100% improvement in $It_2$ current over the ES-DESD architecture.

An overview of the TLP measurement results is presented in Table 2.

TABLE 2

Summary of $It_2$ values achieved in TLP measurements for different stress combinations

| TLP | ES-DESD | CB-DESD |
|---|---|---|
| Vss + IN− | 1 A | 1.5 A |
| IN + Vdd− | 0.9 A | 1.4 A |
| IN + Vss− | 0.9 A | 1.8 A |

Since Charge Device Model (CMD) robustness, whereby 1 kV is injected through an external 1 ohm resistor and an inductor of 10 nH or less coupled in series to ground, is more difficult to obtain than HBM, on-wafer Very Fast TLP (VFTLP) measurements have been performed between different pin-to-pin combinations to find weak spots in the different design architectures. The VFTLP pulses which arrive at the bond pad, i.e. after the probe needles, have 3 ns pulse width and 400 ps rise time, which meets the CDM pulse specification given in the JEDEC standard.

An overview of the VFTLP measurement results is given in Table 3. Very high VFTLP values are obtained already for the reference ES-DESD design. Further, an average improvement with 32% is obtained using CB-DESD, giving VFTLP results up to 12.8 A.

In both cases for all pin combinations, failure was visually observed in the ESD protection diodes of the first amplification stage. Also for CB-DESD, failure occurs at the first stage, indicating that at high current levels, the majority of the ESD current flows through the first stage 61, as was predicted by the HBM SPECTRE® simulations. Indeed once the ESD protection device 8 of the first section 61 is triggered, this first ESD protection device 8 will convey, in relative terms, a larger part of the ESD current than the ESD protection devices of the subsequent sections 62, 63, 64, 65. In the distributed ESD methodology disclosed herein, the trigger voltages of the ESD protection devices 8 are selected such that a more uniform distribution of the ESD current over the different ESD protection devices 6i is obtained.

TABLE 3

Summary of $It_2$ values achieved in VFTLP measurements for different stress combinations

| VFTLP | ES-DESD | CB-DESD |
|---|---|---|
| Vss + IN- | 9.5 A | 12.8 A |
| IN + Vdd- | 8.7 A | 11.5 A |
| IN + Vss- | 9.2 A | 12.1 A |

ESD protection is a real challenge as the downscaled CMOS technologies allow higher operating frequencies while becoming more fragile to ESD. In this embodiment, a distributed ESD protection methodology and architecture, labeled as Center Balanced Distributed ESD (CB-DESD) protection, is disclosed and validated on a 1-110 GHz Distributed Amplifier, implemented in 45 nm CMOS technology. An ESD performance improvement of 50% was demonstrated compared to the conventional distributed ESD solution. Equivalent 2 kV HBM and VFTLP results up to 12.8 A were achieved.

In the previous embodiment the distributed ESD protection methodology was taught by using a distributed amplifier wherein the ESD protection devices 8 of the first two stages 61, 62 of this distributed circuit 1 were selected to only trigger in response of the ESD event after the ESD protection device 8 of at least one subsequent stage 63, 64, 65 of the distributed circuit 1 was triggered. Although at least two ESD protection devices 8 are used having a difference in ESD trigger level, all ESD protection devices 8 are configured to offer the same parasitic impedance in each stage 6i. In the design of the analogue electronic circuit the influence of the distributed ESD protection on the performance of the analogue circuit can hence be easily taken into account by, in first instance, accounting for the same parasitic impedance in each stage of the analogue circuit.

Figure 12:
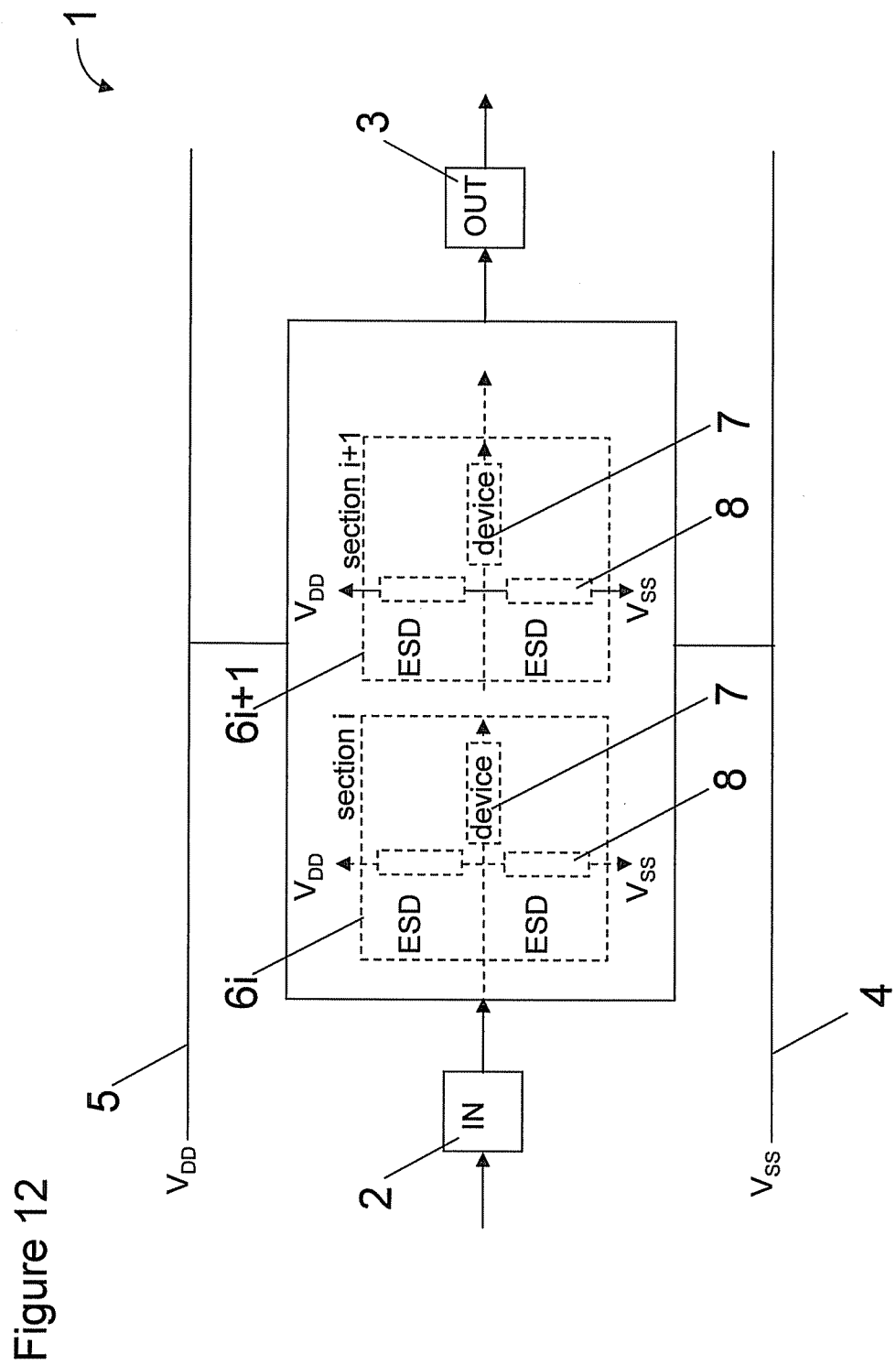
FIG. 12 shows a schematic of an integrated electronic circuit with distributed ESD protection according to an embodiment.

FIG. 12 shows a generic schematic of an integrated electronic circuit 1 configured as a distributed circuit composed of several subsequent sections 6i, with i being an integer ranging from 1 to n, each section 6i offering the same functionality. The distributed circuit 1 is powered via the high power supply line Vdd 5 and the low power supply line Vss 4. In normal operation the signal enters the distributed circuit 1 at the input terminal IN 2 and leaves the distributed circuit 1 at the output terminal OUT 3 after passing through the sections 6i of the distributed circuit 1. Although in the previous embodiment each section 6i contained as functional device 7 an active device such as a transistor used as amplifying device therefore being labeled as gain stage, the distributed ESD protection methodology disclosed here is not limited to hereto. Also a transmission line 9, 10 is an example of a distributed circuit 1, although here each section 6i of the unprotected circuit only contains passive devices 7 such as resistors, inductors and capacitors. A distributed electronic circuit 1 can be considered as an integrated electronic circuit comprising a sequence of sections 6i configured to transfer an electronic signal from one section 6i to an adjacent section 6i+1. The characteristics of this distributed electronic circuit 1 are spatially distributed across the whole geometry of the distributed circuit 1 instead of being allocated to a discrete element. Each section 6i of the ESD unprotected distributed circuit consist of functional elements 7 which can be only passive devices, e.g. for a transmission line 9, 10, only active devices, or a combination of passive and active devices, e.g. a distributed amplifier.

In each section 6i of the distributed circuit 1 an ESD protection device 8 is inserted. In case of a distributed circuit where the functional device 7 is only a passive device, e.g. a transmission line 9, 10, the number n of sections 6i, with i being an integer ranging from 1 to n, is determined by the desired ESD performance. In case of a distributed circuit 1 where the functional device 7 contains an active device, e.g. a distributed amplifier, the number n of sections 6i is determined by the desired circuit performance.

These ESD protection devices 8 are selected and/or configured such that, upon occurrence of an ESD event, the ESD protection device 8 of the first section 61 only triggers after the ESD protection device 8 of at least one of the subsequent sections 6i with i>1 has been triggered. Determining which one (or more) these subsequent sections are to trigger first, is part of the ESD robustness optimisation process. In the first embodiment the ESD protection devices 8 of the first two sections 61, have the same, high, trigger voltage while the ESD protection devices 8 of the last three sections 63, 64, 65 have the same, low, trigger voltage. As the ESD protection devices 8 have different trigger levels the distribution of the ESD current over the distributed electronic circuit 1 can be better controlled thereby improving the overall ESD performance.

In a distributed electronic circuit 1 having a distributed ESD protection architecture according to this disclosure, at least two corresponding ESD protection devices 8 having a different ESD trigger level will be present. The trigger voltage $V_t$ of the ESD protection device 8 can be used as a metric to characterize the trigger level of the device 8. Corresponding refers to the corresponding location of the ESD protection devices 8 in different sections 6i of the distributed electronic circuit 1. Hence at least two groups of ESD protection devices 8 can be distinguished based on their ESD trigger levels. The ESD protection device 8 of the first section 61 is chosen from the group with, in absolute value, has the highest ESD trigger level. Ultimately one can choose to have the ESD protection device 8 of each section 6i triggered at a different ESD level such that the number of ESD trigger levels in the distributed ESD protection equals the number n of sections in the distributed electronic circuit.

Preferably the trigger voltage of the ESD protection devices 8 of a section 6i+1 is equal to or less than the trigger voltage of the previous section 6i. This way one assures that ESD protection device 8 further down the distributed circuit assist in conveying the ESD current before the first section 61 is triggered.

Preferably the ESD protection devices 8 of all sections 6i offer substantially the same parasitic impedance to each section 6i. This way the contribution of each ESD protection device 8 to the overall impedance is the same throughout the distributed electronic circuit 1. Hence this parasitic impedance can be easily taken into account when designing the distributed electronic circuit 1 in view of its desired analogue performance.

As the distributed ESD protection architecture disclosed is characterised by having at least two ESD trigger levels, typically the ESD protection devices 8 of these at least two sections can have different dimensions and/or geometry. By varying the dimensions of the ESD protection elements 81, 82 in function of the trigger voltage of the ESD protection device 8, the circuit ESD protection and the circuit analogue performance can, to large extent, be independently optimised. In the first embodiment a diode 81 was used as ESD protection element to form the ESD protection device 8. If the trigger level of the ESD protection device 8 is to be increased two ESD protection elements, i.e. two diodes 81, were placed in series such that the trigger voltage of the ESD protection device 8 is twice the trigger voltage of a single ESD protection element, i.e. one diode. If this ESD protection device with two diodes in series and hence with a double trigger voltage is to have a parasitic impedance comparable to that of an ESD protection device with a single diode, these series diodes are designed to have twice the area of a single diode.

Other ESD protection devices can be used allowing easy modification of the trigger voltage without substantially changing the parasitic impedance thereof. If FinFET transistors are used as ESD protection devices in an SCR the trigger voltage of these transistor can be tuned by varying the channel length thereof. This variation in channel length will have no or little impact on the parasitic capacitance towards the circuit as this parasitic capacitance is mainly dependent on the drain junction capacitance and gate-drain overlap capacitance. In a diode-trigger silicon controlled rectifier (DTSCR), as e.g. disclosed in published European patent application EP 2 037 501 the trigger voltage of the SCR is dependent on the number of trigger diodes connected in series. Increasing the number of trigger diodes increases the trigger voltage of the DTSCR whereas the parasitic capacitance to the circuit is mainly determined by the transistor connected to the signal path.

As known by a person skilled in the art, different ESD protection elements can be used to build the ESD protection device 8 having the predetermined ESD trigger level and parasitic impedance in the individual sections 6i. Typically such ESD protection elements exhibit a so-called 'snap-back' behaviour, as soon as a given voltage level is exceeded, i.e. when the voltage applied over the ESD protection element exceeds the ESD trigger voltage $V_t$, the ESD protection element switches from a high resistance mode to a low resistance mode thereby offering a high current path. Examples of such ESD protection elements are junctions, transistors such as field effect transistors or bipolar transistors or even more complex elements such as silicon controlled rectifiers.

In the previous paragraphs the distributed ESD protection methodology disclosed herein was, for the purpose of teaching, applied to a distributed amplifier 1. The application of this distributed ESD methodology is not limited to RF circuits but can be applied to all types of distributed circuits 1. Generally speaking a method for designing an ESD protected distributed circuit 1 according to embodiments of this description comprises the steps of first determining the desired performance of the distributed circuit 1 in normal operation. Here parameters such as number of sections, impedance, gain, bandwidth etc. are determined resulting an appropriate architecture and design of its components. Then the desired ESD performance of this distributed circuit 1 is determined as disclosed in the previous paragraphs. Here parameters such as holding voltage, breakdown current, trigger voltages, etc. are determined such that the ESD protection device 8 of the first section 61 triggers later in the ESD event such that ESD protection devices 8 further down 62, 63, 64, 65 the distributed circuit 1 first start to convey the ESD current. As the ESD performance of the distributed network 1 is in first instance determined by way the ESD current is uniformly distributed over the ESD protection devices, one can make a first order estimation of the ESD performance of the distributed circuit 1 without the active functional devices 7 and only take into account the distributed ESD protection and the impedance of the distributed circuit 1. One can even upfront determine the ESD performance for a given distributed ESD protection circuit, using the distributed ESD protection methodology according to embodiments, using the number n of ESD stages and the trigger voltage of the corresponding ESD protection devices 8 as parameters to obtain the desired ESD performance. Once the distributed ESD protection is designed and the parasitic impedance of the ESD protection device 8 is known, the performance of the ESD protected distributed circuit 1 is checked and compared with the desired performance. If the performance in normal operation of the ESD protected distributed circuit 1 is outside the design margins, one has to review the distributed ESD protection and iterate again.

Figure 13:
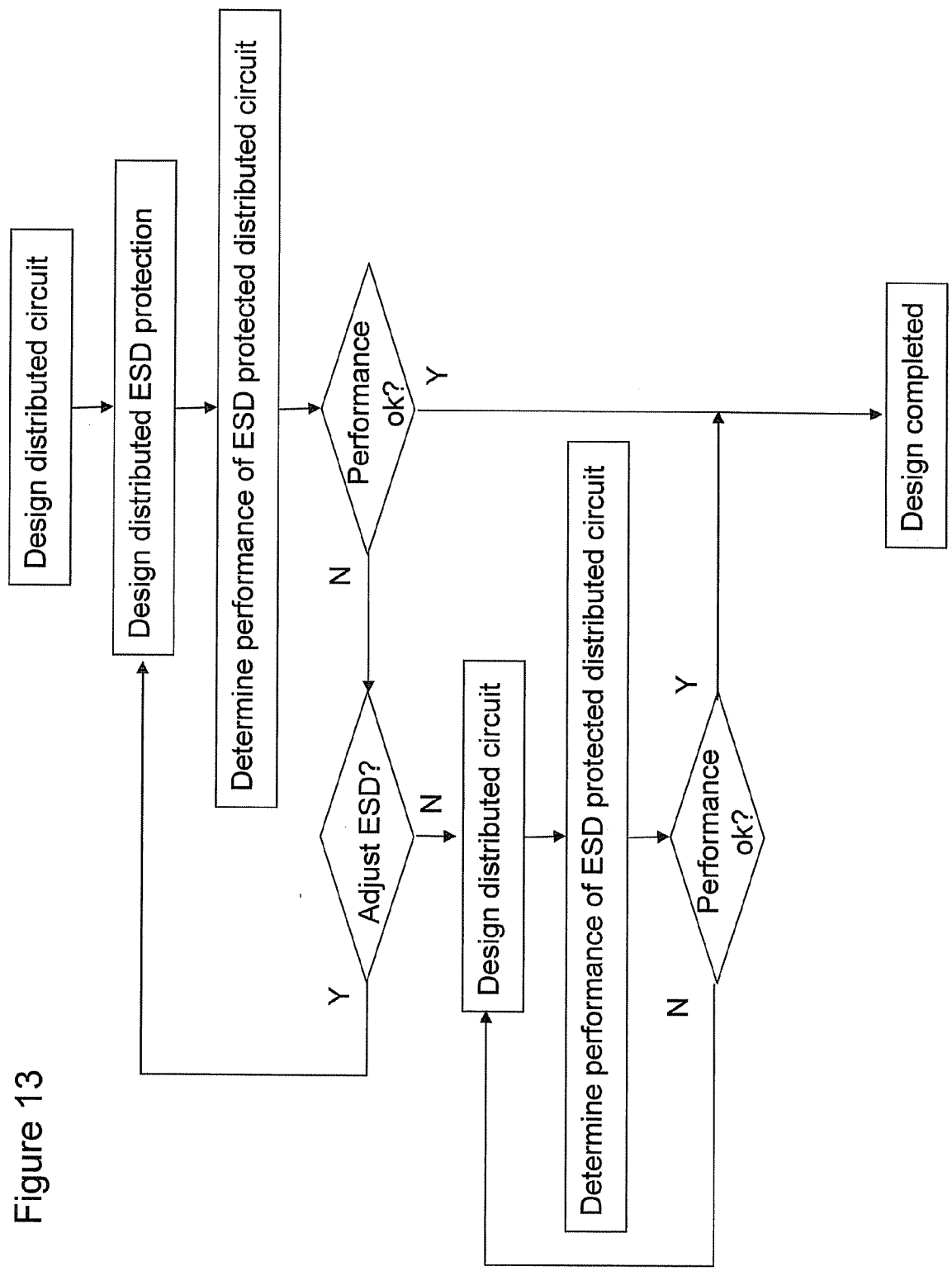
FIG. 13 shows a flowchart illustrating the ESD design methodology disclosed herein.

FIG. 13 shows a flowchart illustrating the above design methodology. First the distributed circuit 1 with the desired performance during normal operation is designed. Then the distributed ESD protection is designed in accordance with the distributed ESD protection methodology disclosed. The performance of the, now, ESD protected distributed circuit during normal operation is determined taking into account the contribution of the impedance of the ESD protection devices 8 in the different sections 6i of the distributed circuit 1. If this performance is within the design margin, the design process is finished. If not, first the distributed ESD protection is adjusted to further reduce the impact of ESD protection devices 8 on the circuit performance e.g. by selecting other ESD protection devices with the desired trigger voltage but with different impedance. If redesigning the distributed ESD protection doesn't allow meeting the design margin, then the distributed circuit is adjusted taking into account the impedance of the ESD protection devices.

The invention claimed is:

1. A distributed electronic circuit comprising:
   an input terminal;
   an output terminal;
   one or more power supply lines; and
   a sequence of sections between the input terminal and the output terminal, wherein each section of the sequence of sections comprises at least one functional device and at least one Electro Static Discharge (ESD) protection device configured to, in response to an ESD event, bypass the functional device and convey corresponding ESD currents to a power supply line of the one or more power supply lines, and
   wherein an ESD protection device of a first section in the sequence of sections is selected such that, in response to the ESD event, at least one section subsequent to the first section in the sequence of sections is triggered before the first section.

2. The distributed electronic circuit according to claim 1, wherein:
   a trigger voltage of the ESD protection device of the first section is higher, in absolute value, than a trigger voltage of an ESD protection device of a section subsequent to the first section in the sequence of sections.

3. The distributed electronic circuit according to claim 2, wherein:

the trigger voltage of the ESD protection device in the first section is equal to or smaller than a trigger voltage of a ESD protection device of a section preceding the first section in the sequence of sections.

4. The distributed electronic circuit according to claim 1, wherein each ESD protection device in the sequence of sections has substantially the same impedance.

5. The distributed electronic circuit according to claim 2, wherein each ESD protection device in the sequence of sections has substantially the same impedance.

6. The distributed electronic circuit according to claim 1, wherein:
   the distributed electronic circuit is a transmission line and the at least one functional device is a passive device.

7. The distributed electronic circuit according to claim 2, wherein:
   the distributed electronic circuit is a transmission line and the at least one functional device is a passive device.

8. The distributed electronic circuit according to claim 1, wherein:
   the distributed electronic circuit is a distributed amplifier and the at least one functional device is an active device.

9. The distributed electronic circuit according to claim 2, wherein:
   the distributed electronic circuit is a distributed amplifier and the at least one functional device is an active device.

* * * * *